United States Patent
Tanaka et al.

(10) Patent No.: US 11,948,789 B2
(45) Date of Patent: Apr. 2, 2024

(54) WAFER PRODUCTION METHOD

(71) Applicant: SUMCO CORPORATION, Tokyo (JP)

(72) Inventors: Toshiyuki Tanaka, Tokyo (JP); Yasuyuki Hashimoto, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 903 days.

(21) Appl. No.: 16/969,836

(22) PCT Filed: Feb. 21, 2018

(86) PCT No.: PCT/JP2018/006188
§ 371 (c)(1),
(2) Date: Aug. 13, 2020

(87) PCT Pub. No.: WO2019/163017
PCT Pub. Date: Aug. 29, 2019

(65) Prior Publication Data
US 2020/0381243 A1  Dec. 3, 2020

(51) Int. Cl.
*H01L 21/02* (2006.01)
*B24B 7/04* (2006.01)
*B24B 7/22* (2006.01)

(52) U.S. Cl.
CPC .......... *H01L 21/02013* (2013.01); *B24B 7/04* (2013.01); *B24B 7/228* (2013.01); *H01L 21/02024* (2013.01)

(58) Field of Classification Search
CPC ......... H01L 21/02013; H01L 21/02024; H01L 21/02104; H01L 21/302; B24B 7/22;
(Continued)

(56) References Cited

U.S. PATENT DOCUMENTS

| 2014/0295645 A1 | 10/2014 | Kurokawa |
| 2015/0004799 A1 | 1/2015 | Tanaka et al. |
| 2015/0303049 A1* | 10/2015 | Tanaka .................. B28D 5/045 451/41 |

FOREIGN PATENT DOCUMENTS

| CN | 102263023 A | 11/2011 |
| CN | 104769704 A | 7/2015 |

(Continued)

OTHER PUBLICATIONS

Notice of Allowance for JP App. No. 2020-501895, dated Apr. 6, 2021 (w/ partial translation).
(Continued)

*Primary Examiner* — Eric J Rosen
*Assistant Examiner* — Aaron R McConnell
(74) *Attorney, Agent, or Firm* — Greenblum & Bernstein, P.L.C.

(57) ABSTRACT

A manufacturing method of a wafer includes a first and a second resin-application grinding step, and a third surface-grinding step. The first step includes: a first formation step of forming a first coating layer; a first surface-grinding step of placing the wafer so that the first coating layer contacts a reference surface of a table and surface-grinding a first surface of the wafer; and a first removal step of removing the first coating layer. The second step includes: a second formation step of forming a second coating layer; a second surface-grinding step of placing the wafer so that the second coating layer contacts the reference surface and surface-grinding the second surface; and a second removal step of removing the second coating layer. In the third step, the wafer is placed so that the last surface-ground surface contacts the reference surface and a surface opposite the contacted surface is surface-ground.

5 Claims, 8 Drawing Sheets

(58) Field of Classification Search
CPC ....... B24B 7/228; B24B 37/005; B24B 37/04; B24B 37/042; B24B 37/07; B24B 37/10; B24B 37/105
USPC .......................................................... 451/41
See application file for complete search history.

(56) References Cited

FOREIGN PATENT DOCUMENTS

| JP | 8-66850 | 3/1996 |
|----|---------|--------|
| JP | 10-286750 | 10/1998 |
| JP | H11-111653 A | 4/1999 |
| JP | 2006-261527 A | 9/2006 |
| JP | 2006-269761 | 10/2006 |
| JP | 2009-272557 | 11/2009 |
| JP | 2010-74056 | 4/2010 |
| JP | 2011-003379 A | 1/2011 |
| JP | 2011-98414 A | 5/2011 |
| JP | 2014-11378 | 1/2014 |
| JP | 2015-8247 | 1/2015 |
| JP | 2015-38919 A | 2/2015 |
| KR | 10-2014-0118754 A | 10/2014 |
| KR | 10-2015-0001611 A | 1/2015 |
| KR | 10-2015-0038541 A | 4/2015 |
| TW | 201724240 | 7/2017 |
| WO | 2017/134925 | 8/2017 |

OTHER PUBLICATIONS

Official Communication issued in International Bureau of WIPO Patent Application No. PCT/JP2018/006188, dated Apr. 10, 2018.
Office Action issued in Taiwan Counterpart Patent Appl. No. 108102373, dated Sep. 20, 2019, along with an English translation thereof.
Notice of Allowance for KR App. No. 10-2020-7023322, dated Oct. 28, 2021 (w/ partial translation).
IPRP for PCT/JP2018/006188, dated Aug. 27, 2020.
Notice of Allowance for CN App. No. 201880090100.4, dated Sep. 6, 2023 (w/ translation).

* cited by examiner

FIG. 7
LEVEL DIFFERENCE
+ 20 nm
-20nm
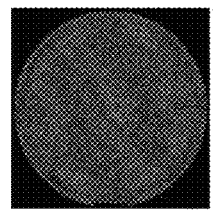 EXAMPLE 1
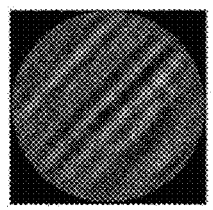 COMPARATIVE 1
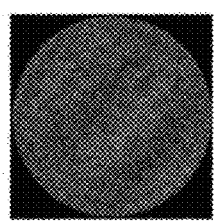 COMPARATIVE 2

WAFER PRODUCTION METHOD

TECHNICAL FIELD

The present invention relates to a manufacturing method of a wafer.

BACKGROUND ART

In order to create a minute pattern through photolithography, it is necessary to planarize a surface of a wafer. Especially, it has been recently proposed to reduce a so-called "nanotopography," which is surface undulation having components of a wavelength λ ranging from 0.2 mm to 20 mm and PV (Peak to Valley) value ranging from 0.1 μm to 0.2 μm, to enhance flatness of a wafer (see, for instance, Patent Literatures 1, 2).

A manufacturing method disclosed in Patent Literature 1 includes a resin application step of entirely covering a first surface of a wafer produced by slicing an ingot, a step of grinding a second surface of the wafer while holding the first surface, and, subsequently, a step of grinding the first surface of the wafer while holding the second surface.

In a manufacturing method disclosed in Patent Literature 2, after a curable resin is applied on a second surface of a wafer and the curable resin is flatly shaped and cured, a first surface of the wafer is ground while the flat surface of the curable resin is held and, subsequently, the curable resin is removed. It should be noted that this technique will be sometimes referred to as "resin-application grinding" hereinafter. Next, the second surface is ground while the first surface of the wafer subjected to the resin-application grinding is held. Then, the resin-application grinding and the surface-grinding of the surface not ground through the resin-application grinding are repeated.

Meanwhile, in order to slice a monocrystal ingot, it is proposed to use a fixed-abrasive-grain wire saw, in which abrasive grains are fixed on an outer circumferential surface of the wire, instead of a loose-abrasive grain process of supplying abrasive-grain-containing cutting fluid, thereby reliably supplying the abrasive grains near to the cylinder center of the monocrystal ingot (see, for instance, Patent Literature 3).

CITATION LIST

Patent Literature(s)

Patent Literature 1 JP 08-066850 A
Patent Literature 2 JP 2015-008247 A
Patent Literature 3 JP 2010-074056 A

SUMMARY OF THE INVENTION

Problem(s) to be Solved by the Invention

In the grinding step through application of the resin as disclosed in Patent Literature 1, since the resin is applied while the undulation and warpage of the wafer are present, the undulation remains due to the difference in the resin thickness causing a difference in elastic deformation of the resin.

According to the disclosure of Patent Literature 2, the undulation is removed by the repetition of the sequence of the resin-application grinding and the surface-grinding. However, the repetition of the grinding of both of the surfaces of the wafer requires at least four grinding steps, resulting in low productivity.

The surface conditions of the wafer at the time of slicing have not been regarded as much of a problem because, even when the undulation remains on the wafer surface, the wafer is ground to remove the undulation after a flat reference surface is created by the resin applied on the wafer surface during the resin application step. However, it has been found through an experiment by the present inventors that, even after the resin application process as disclosed in Patent Literature 1, nanotopography quality of the wafer surface after mirror-polishing is still insufficient.

In addition, it is also found that the use of the fixed-abrasive-grain wire in the slicing step as in Patent Literature 3 causes a large process damage on the wafer and, consequently, very large undulation on the wafer surface after the slicing step, resulting in further deteriorated nanotopography.

An object of the invention is to provide a manufacturing method of a wafer capable of manufacturing a wafer with excellent nanotopography characteristics without impairing productivity.

Means for Solving the Problem(s)

As a result of dedicated studies for achieving the above object, it is found by the inventors that, when a wafer surface is surface-ground after being coated with a curing material, the productivity of the wafer can be enhanced and nanotopography quality of the resulting wafer can be enhanced by, instead of surface-grinding only once on one surface after applying the curing material on an opposite surface, in addition to the initial surface-grinding, performing a second surface-grinding on the opposite surface after applying the curing material on the one surface, and, in addition, performing a third surface-grinding on the surface ground at the initial surface-grinding, thereby reaching the invention.

Specifically, after a slicing step, a first surface of a wafer is surface-ground with a second surface thereof being coated with a curing material. Then, after the curing material on the second surface is removed, the second surface is surface-ground with the first surface being coated with the curing material. Further, after removing the curing material on the first surface, the first surface is surface-ground. Through the above process, the nanotopography quality can be enhanced without impairing the productivity.

A first aspect of the invention is a manufacturing method of a wafer produced by slicing a monocrystal ingot using a wire-saw machine and grinding the wafer, the method including: a first resin-application grinding step; a second resin-application grinding step; and a third surface-grinding step, where the first resin-application grinding step includes: a first coating-layer formation step of applying a curing material all over a second surface of the wafer to form a flat first coating layer; a first surface-grinding step of placing the wafer on a table of a grinding machine so that the first coating layer is in contact with a reference surface of the table and, subsequently, surface-grinding a first surface of the wafer by the grinding machine; and a first coating-layer removal step of removing the first coating layer after the first surface-grinding step from the second surface of the wafer, the second resin-application grinding step includes: a second coating-layer formation step of applying the curing material all over the first surface of the wafer to form a flat second coating layer; a second surface-grinding step of placing the wafer on the table of the grinding machine so that the second coating layer is in contact with the reference surface of the table and, subsequently, surface-grinding the second surface of the wafer by the grinding machine; and a second coating-layer removal step of removing the second coating layer after the second surface-grinding step from the first surface of the wafer, and the third surface-grinding step includes: placing the wafer on the table so that a lastly surface-ground surface is in contact with the reference surface of the table of the grinding machine and, subsequently, surface-grinding a surface of the wafer opposite the surface in contact with the reference surface by the grinding machine.

According to the above first aspect of the invention, a wafer with excellent nanotopography quality can be manufactured without impairing productivity.

A second aspect of the invention is a manufacturing method of a wafer based on the first aspect, in which, between the second resin-application grinding step and the third surface-grinding step: the first resin-application grinding step is only additionally performed; or at least one repetition of the first resin-application grinding step and the second resin-application grinding step is additionally performed in this order; or at least one repetition of the first resin-application grinding step and the second resin-application grinding step is performed in this order and, subsequently, the first resin-application grinding step is performed.

According to the above second aspect of the invention, a wafer with further excellent nanotopography quality can be manufactured by performing the first resin-application grinding step and the second resin-application grinding step for a plurality of times.

A third aspect of the invention is a manufacturing method of a wafer, in which a grinding allowance in the first resin-application grinding step is equal to or more than a grinding allowance in the third surface-grinding step.

According to the above third aspect of the invention, a wafer with excellent nanotopography quality can be manufactured by setting the grinding allowance in the first resin-application grinding step to be equal to or more than the grinding allowance in the third surface-grinding step even with a small grinding allowance in total.

A fourth aspect of the invention is a manufacturing method based on the first to third aspects, in which the wire-saw machine slices the monocrystal ingot using a fixed-abrasive-grain wire.

According to the fourth aspect of the invention, even when a wafer with large undulation obtained using, especially, a fixed-abrasive-grain wire-saw machine is used, the undulation can be minimized by the manufacturing method, so that a wafer with excellent nanotopography quality can be manufactured.

A fifth aspect of the invention is an invention based on the first to fourth aspects, in which a diameter of the wafer is 300 mm or more, and especially 450 mm or more.

According to the above fifth aspect of the invention, a wafer with excellent nanotopography quality can be manufactured even when the diameter of the wafer is 300 mm or more, or especially 450 mm or more even with a small grinding allowance in total.

BRIEF DESCRIPTION OF DRAWING(S)

FIG. 7 is a nanotopography map of Example 1 and Comparatives 1, 2 after a mirror-polishing step.

DESCRIPTION OF EMBODIMENT(S)

Exemplary embodiment(s) of the invention will be described below with reference to the attached drawings.

Figure 1:
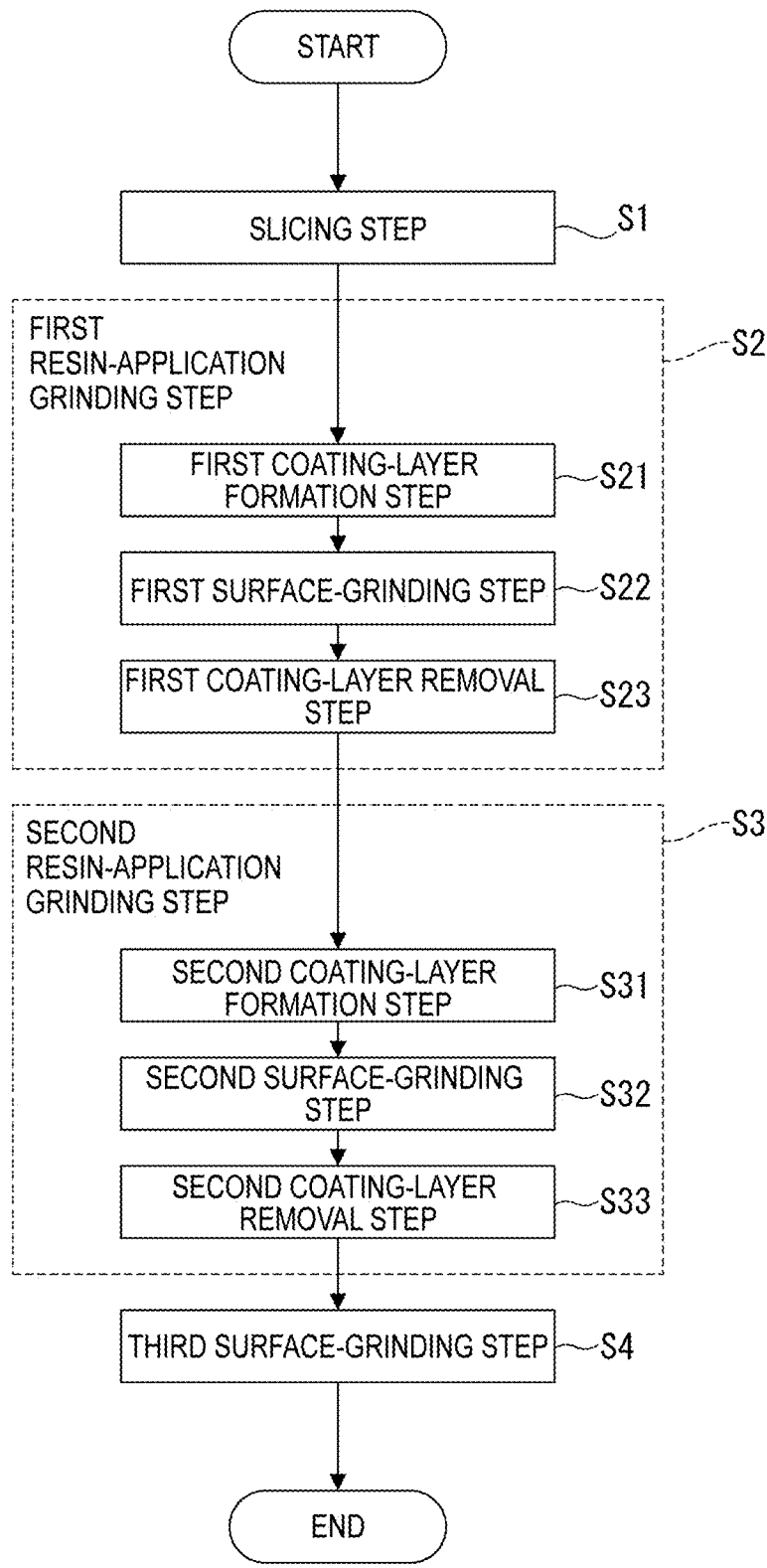
FIG. 1 is a flowchart showing an overall procedure of a manufacturing method of a wafer according to an exemplary embodiment of the invention.

As shown in FIG. 1, a manufacturing method of a wafer includes a slicing step S1 of slicing a monocrystal ingot using a wire-saw machine to produce a thin disc-shaped wafer, a first resin-application grinding step S2, a second resin-application grinding step S3, and a third surface-grinding step S4. The first resin-application grinding step S2 includes: a first coating-layer formation step S21 of applying the curing material all over a second surface of the wafer to form a flat first coating layer; a first surface-grinding step S22 of placing the wafer on a table so that the first coating layer is in contact with a reference surface of the table of the grinding machine and, subsequently, surface-grinding the first surface of the wafer with the grinding machine; and a first coating-layer removal step S23 of removing the first coating layer from the second surface of the wafer after the first surface-grinding step S22. The second resin-application grinding step S3 includes: a second coating-layer formation step S31 of applying the curing material all over the first surface of the wafer to form a flat second coating layer; a second surface-grinding step S32 of placing the wafer on the table so that the second coating layer is in contact with the reference surface of the table of the grinding machine and, subsequently, surface-grinding the second surface of the wafer with the grinding machine; and a second coating-layer removal step S33 of removing the second coating layer from the first surface of the wafer after the second surface-grinding step S32. In the third surface-grinding step S4, the wafer is placed on the table so that the surface subjected to the surface-grinding for the last time is in contact with the reference surface of the table of the grinding machine and, subsequently, the surface of the wafer opposite the surface in contact with the reference surface is surface-ground by the grinding machine.

It should be noted that a lapping step may be performed in a period between the slicing step S1 and the first resin-application grinding step S2. Further, a step of chamfering an outer periphery of the wafer, which is not specifically described, may be performed at any period from a time after the slicing step S1 to a time after the third surface-grinding step S4 and by any number of (i.e. one or more) times, where, for instance, a first chamfering is performed after the slicing step S1 and a second chamfering for a larger chamfering amount than in the first chamfering may be performed after the third surface-grinding step S4.

Further, in the manufacturing method of the wafer in the exemplary embodiment, it is only necessary for each of the first resin-application grinding step S2 and the second resin-application grinding step S3 to be performed for at least once. For instance, between the second resin-application grinding step S3 and the third surface-grinding step S4, only the first resin-application grinding step S2 may be additionally performed, the first resin-application grinding step S2 and the second resin-application grinding step S3 may be repetitively performed in this order for at least once, or, after the first resin-application grinding step S2 and the second resin-application grinding step S3 are repetitively performed in this order for at least once, the first resin-application grinding step S2 may be performed as the last step. It should be noted that, in the third surface-grinding step S4, the surface not subjected to the surface-grinding in the first resin-application grinding step S2 or the second resin-application grinding step S3 performed immediately before the third surface-grinding step S4 is surface-ground.

Satisfactory nanotopography characteristics of the wafer surface can be achieved by dividing the resin-application grinding step into a plurality of times of the resin-application grinding steps for the top and bottom surfaces of the wafer. Specifically, though it is difficult to completely remove the undulation component present on the wafer in a single resin-application grinding to enhance the nanotopography characteristics, it is found that the repetition of the resin-application grinding steps can improve the nanotopography characteristics each time the resin-application grinding step is repeated. As described above, the repetition of the resin-application grinding steps can reduce the undulation on the wafer surface to improve the nanotopography characteristics of the wafer surface.

Figure 2:
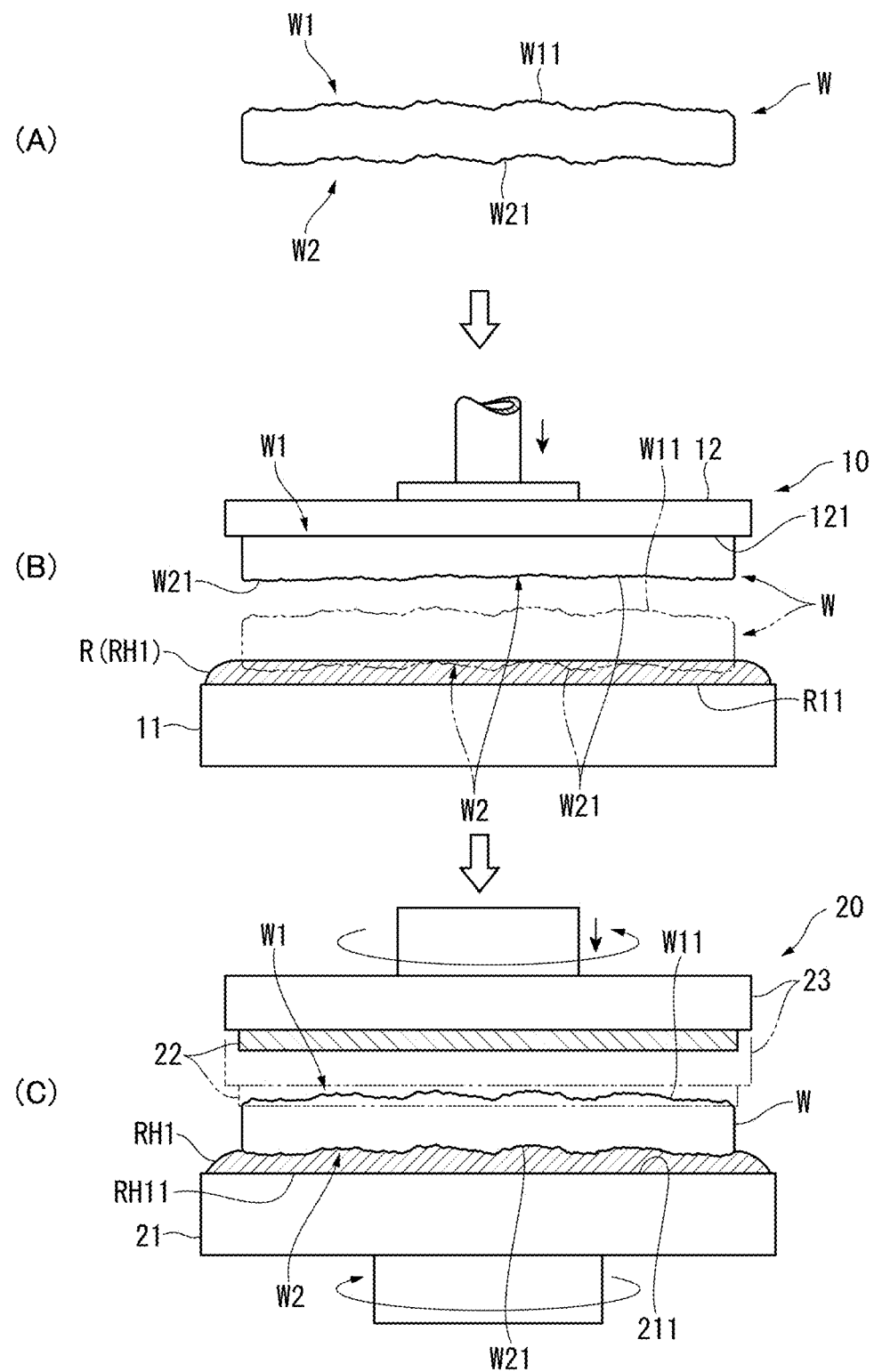
FIG. 2 illustrates the manufacturing method of the wafer.

Next, the manufacturing method of the wafer will be described in detail with reference to FIG. 2.

FIG. 2(A) shows the conditions of a wafer W produced by slicing an ingot using the fixed-abrasive-grain wire saw.

A plurality of wafers W can be produced in a single slicing step from the ingot using a known multi-wire-saw machine (not shown). The multi-wire-saw machine includes a guide roller provided with a plurality of grooves for guiding a plurality of wires, a roller for rotating the wires, and the plurality of wires made of ultra-thin steel wires and wound around the guide roller and the roller. The roller is rotated at a high speed, and a to-be-cut object is pressed against the plurality of wires exposed between the guide roller and the roller to cut the object into a plurality of pieces.

The multi-wire-saw machine is categorized into a fixed abrasive grain type machine and a loose-abrasive-grain type machine depending on a usage of the abrasive grains for slicing. The fixed abrasive grain type machine uses wires in a form of steel wires adhered with diamond abrasive grains or the like through vapor deposition or the like. In the loose-abrasive-grain type machine, the wires are used while applying a slurry containing a mixture of abrasive grains and oil solution. The fixed abrasive grain type machine, in which the wires adhered with the abrasive grains themselves slice the object, requires short slicing time and are excellent in terms of productivity. Further, the slurry, which possibly contains swarf as a result of the slicing, is not used in the fixed abrasive grain type machine and thus is not necessary to be disposed of. Accordingly, the fixed abrasive grain type machine is environmentally friendly and economical.

Both of the types of the machine are usable in the exemplary embodiment. However, the fixed abrasive grain type machine is preferable in terms of the environmental and economical advantages. It should be noted that the use of the fixed-abrasive-grain wire saw applies a large machining damage on the wafer surface and results in large undulation generated on the wafer surface after the slicing step, so that the nanotopography may become unfavorable. However, with the use of the method of invention, a wafer excellent in nanotopography characteristics (i.e. with a small value of nanotopography) can be produced.

As shown in FIG. 2(A), cyclically occurring undulations W11, W12 are present on a first surface W1 and a second surface W2 of the wafer W after the slicing step by the fixed-abrasive-grain wire saw and a lapping step.

FIG. 2(B) shows an example of a holding press device 10 used in the first coating-layer formation step S21. Initially, a curing material R, which forms a coating layer, is dropped on a highly planarized plate 11 of the holding press device 10. Meanwhile, with the first surface W1 of the wafer W being sucked and held on a holding surface 121 of a holder 12, the holding surface 121 is moved downward to press the second surface W2 of the wafer W against the curing material R. Subsequently, while the pressure applied on the holding surface 121 is released to eliminate elastic deformation on the undulations W11, W21 remaining on the wafer W, the curing material R on the second surface W2 of the wafer W is cured to form a first coating layer RH1. The surface of the first coating layer RH1 in contact with the plate 11 becomes highly planarized through the above step, defining a reference surface RH11 for grinding the first surface W1 of the wafer W.

The curing material R can be applied on the wafer W through, for instance: spin coating where the curing material R is dropped on the second surface W2 of the wafer W with the second surface W2 facing upward and the wafer W is rotated to spread the curing material R all over the second surface W2; screen printing where a screening film is placed on the second surface W2 with the curing material R being placed on the screening film and the curing material R is squeezed using a squeegee; applying the curing material R all over the second surface W2 through spraying by electric spray deposition or the like and subsequently contacting and pressing the coated surface against the highly planarized plate 11; and, in addition to the above processes, processes capable of highly planarizing a surface of the wafer W with the curing material R. The curing material R is preferably a thermosetting resin, a thermoreversible resin, a photosensitive resin or the like in terms of peelability after being processed. Particularly, the photosensitive resin is also preferable in that a stress due to heat is not applied. In the exemplary embodiment, a UV-curable resin is used as the curing material R. Specific examples of the material for the curing material R include a synthetic rubber and an adhesive (e.g. wax).

FIG. 2(C) shows an example of a surface grinder 20 used in the first surface-grinding step S22. Initially, the reference surface RH11 of the first coating layer RH1 formed in the first coating-layer formation step S21 is placed on and sucked and held by a highly planarized reference surface 211 of a vacuum chuck table 21 of the surface grinder 20. Subsequently, a grinding wheel 23 provided with a grinding stone 22 on one side thereof is placed on the upper side of the wafer W placed on the reference surface 211. Then, while the grinding stone 22 is kept in contact with the first surface W1 of the wafer W, the grinding wheel 23 and the vacuum chuck table 21 are rotated to grind the first surface W1 of the wafer W.

Figure 3:
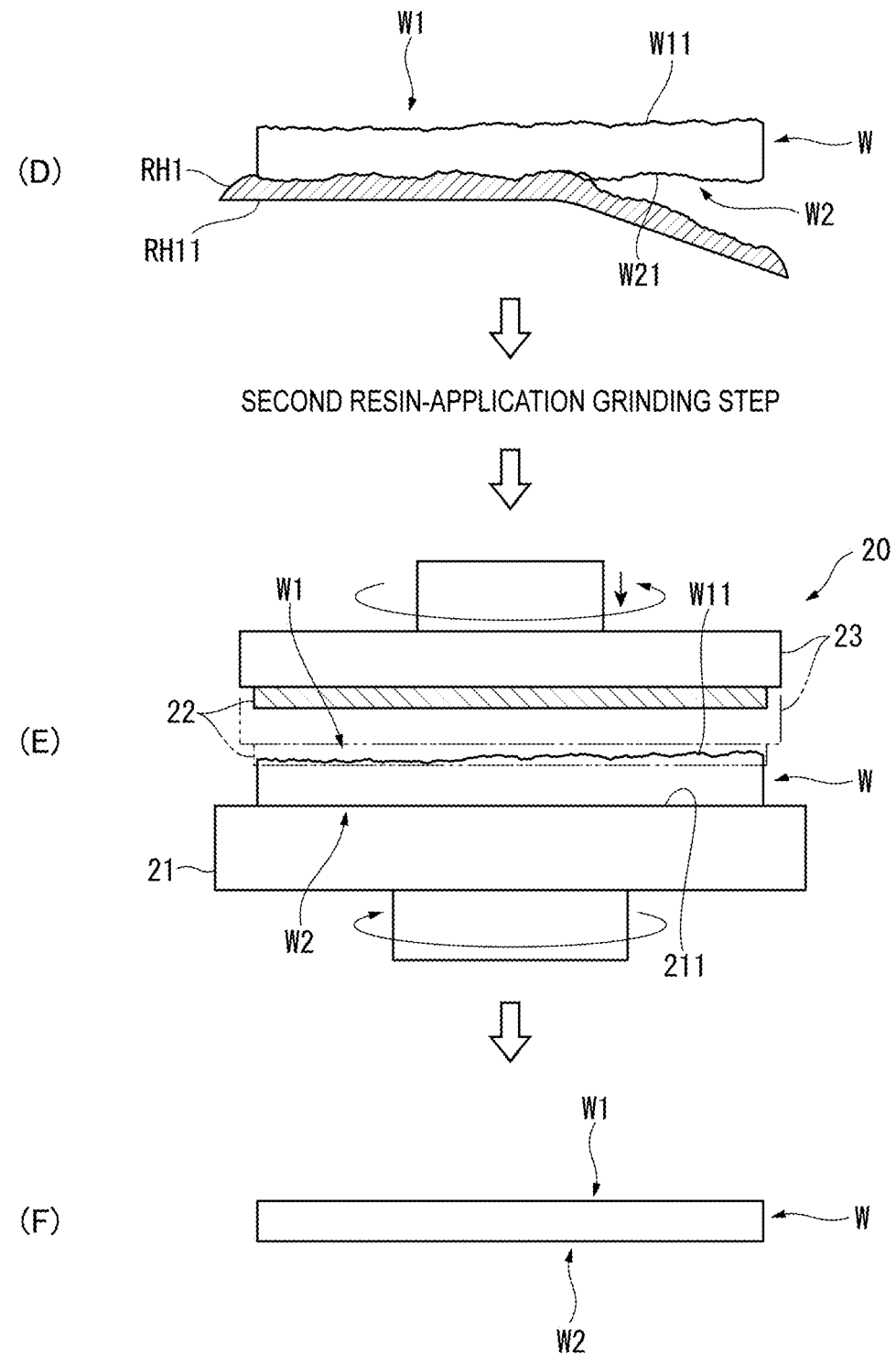
FIG. 3 illustrates steps of the manufacturing method of the wafer subsequent to the steps shown in FIG. 2.

FIG. 3(D) shows the first coating-layer removal step S23. The first coating layer RH1 is peeled off from the wafer W whose first surface W1 is surface-ground in the first surface-grinding step S22. The first coating layer RH1 may be chemically removed using a solvent.

At this time, the undulation W11 still remains on the surface-ground first surface W1 of the wafer W, though slightly reduced by the surface-grinding. It is speculated that this is because the thickness of the first coating layer RH1 differs depending on parts of the wafer surface due to the size of the undulation W21, so that a difference in elastic deformation of the parts of the wafer, which is caused by the pressure applied during the surface-grinding, is expressed in a form of the residual undulation W11.

Subsequently, the second coating-layer formation step S31 of forming the second coating layer on the first surface W1 using the same machine as that used in the first coating-layer formation step S21 shown in FIG. 2(B), the second surface-grinding step S32 of surface-grinding the second surface W2 using the same machine as that used in the first surface-grinding step S22 shown in FIG. 2(C), and the second coating-layer removal step S33 of peeling the second coating layer from the first surface W1 as in the first coating-layer removal step S23 shown in FIG. 3(A) are performed. In other words, the second resin-application grinding step S3 is performed.

FIG. 3(E) shows an example of the third surface-grinding step S4. The machine for the surface-grinding is the same as the surface grinder 20 used in the first surface-grinding step S22. For instance, when the second resin-application grinding step S3 is performed immediately before the third surface-grinding step S4, the second surface W2 of the wafer W subjected to the surface-grinding in the second surface-grinding step S32 is directly placed on and sucked and held by the reference surface 211 of the vacuum chuck table 21 and the first surface W1 of the wafer W is ground. Thus, the wafer W, whose both surfaces are highly planarized, can be obtained as shown in FIG. 3(F).

It should be noted that the first resin-application grinding step S2 and/or the second resin-application grinding step S3 may further be performed between the second resin-application grinding step S3 and the third surface-grinding step S4.

For instance, when the third surface-grinding step S4 is performed after the first resin-application grinding step S2 and the second resin-application grinding step S3 are repeated in this order for three times, the grinding allowance in each grinding step is 15 to 30 µm in the initial first surface-grinding step S22, 20 to 40 µm in the initial second surface-grinding step S32, 5 to 10 µm in the secondary first surface-grinding step S22, and 5 to 10 µm in the secondary and tertiary second surface-grinding step S32 and tertiary first surface-grinding step S22. Both surfaces of the wafer W, which have experienced the third surface-grinding step S4 and are thus highly planarized, exhibit improved nano-topography characteristics each time the grinding step is performed. The number of times of the resin-application grinding steps is three (two first resin-application grinding steps S2 and one second resin-application grinding step S3) or more and may be determined depending on the necessary nanotopography characteristics.

EXAMPLES

Next, Example of the invention as well as Comparatives will be described in detail below. It should be noted that the wafers W used in Example 1 and Comparatives 1, 2 are 300-mm-diameter wafers W obtained by slicing a silicon monocrystal ingot under the same conditions using a fixed abrasive grain wire-saw machine.

Example 1

Figure 4:
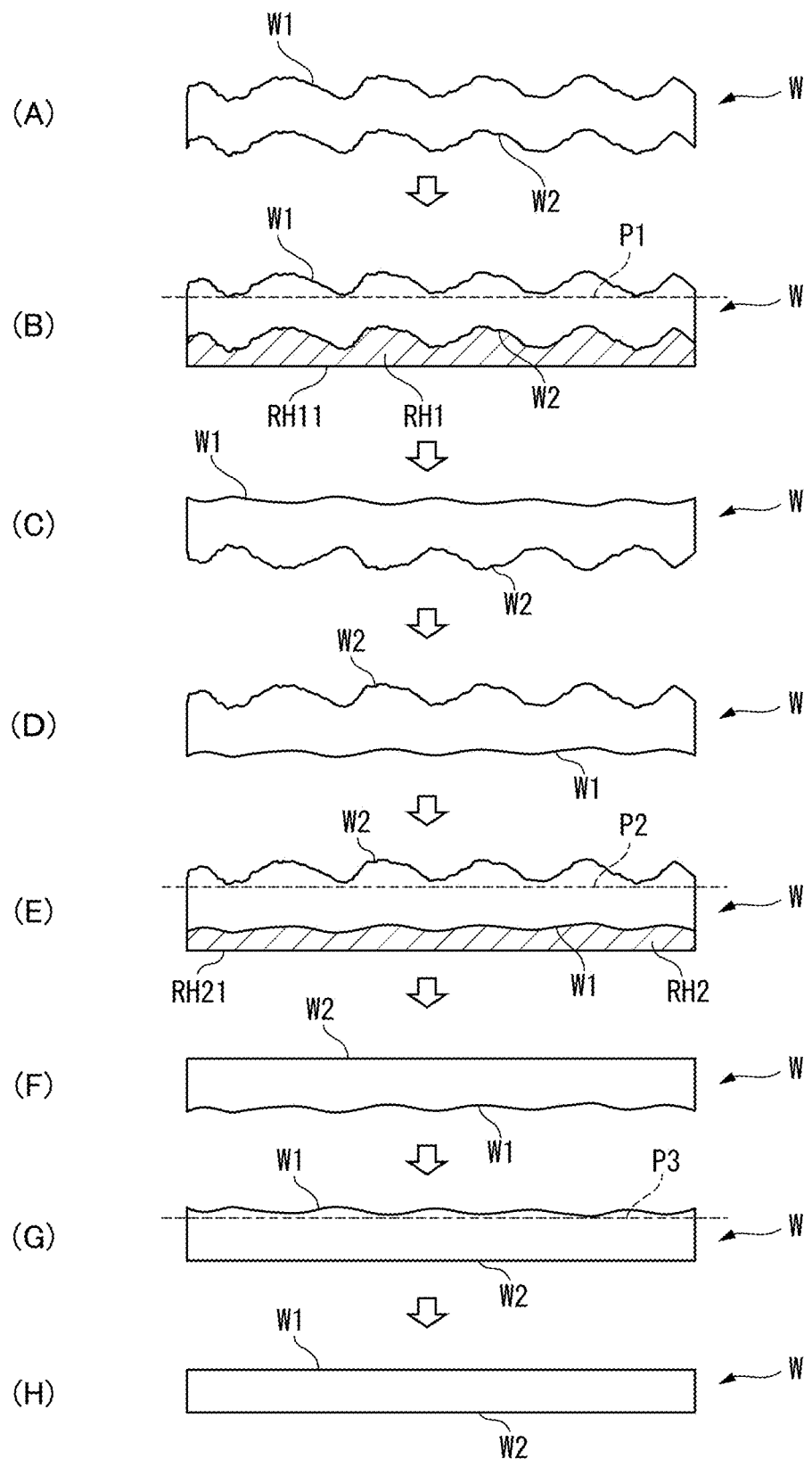
FIG. 4 illustrates the manufacturing method of the wafer according to Example 1 of the invention.

The conditions of the wafer in respective steps of Example 1 of the invention are shown in FIG. 4. Processing steps of Example 1 will be described with reference to FIG. 4.

As shown in FIG. 4(B), a UV curable resin was applied and cured on the second surface W2 of the wafer W after the slicing step S1 shown in FIG. 4(A), thereby forming the first coating layer RH1 having the flat reference surface RH11 (first coating-layer formation step S21). It should be noted that the first coating layer RH1, which was formed on the second surface W2, may be initially formed on the first surface W1. When the first coating layer RH1 is formed on the first surface W1, the second surface W2 and the first surface W1 are switched in the description below.

Subsequently, with the reference surface RH11 of the first coating layer RH1 being sucked and held by the vacuum chuck table 21, the first surface W1 of the wafer W was surface-ground by a first grinding allowance of 15 µm (to a plane indicated by a dashed line P1) (first surface-grinding step S22). Then, as shown in FIG. 4(C), the first coating layer RH1 was peeled off (first coating-layer removal step S23).

Next, as shown in FIG. 4(D), after the wafer W having experienced the first resin-application grinding step S2 was reversed (first reversing step), a UV curable resin was applied and cured on the first surface W1 of the wafer W to form the second coating layer RH2 having the flat reference surface RH21 as shown in FIG. 4(E) (second coating-layer formation step S31). Then, with the reference surface RH21 being sucked and held by the vacuum chuck table 21, the second surface W2 of the wafer W was surface-ground by a second grinding allowance of 20 µm (to a plane indicated by a dashed line P2) (second surface-grinding step S32). Then, as shown in FIG. 4(F), the second coating layer RH2 was peeled off (second coating-layer removal step S33).

Subsequently, after the wafer W having experienced the second resin-application grinding step S3 was reversed as shown in FIG. 4(G) (second reversing step), with the second surface W2 after the second resin-application grinding step S3 being sucked and held by the vacuum chuck table 21, the first surface W1 of the wafer W was surface-ground by a third grinding allowance of 5 µm (to a plane indicated by a dashed line P3) (third surface-grinding step S4).

The entire process was thus completed, whereby the wafer W of Example 1 whose both surfaces were highly planarized as shown in FIG. 4(H) was obtained.

Comparative 1

Figure 5:
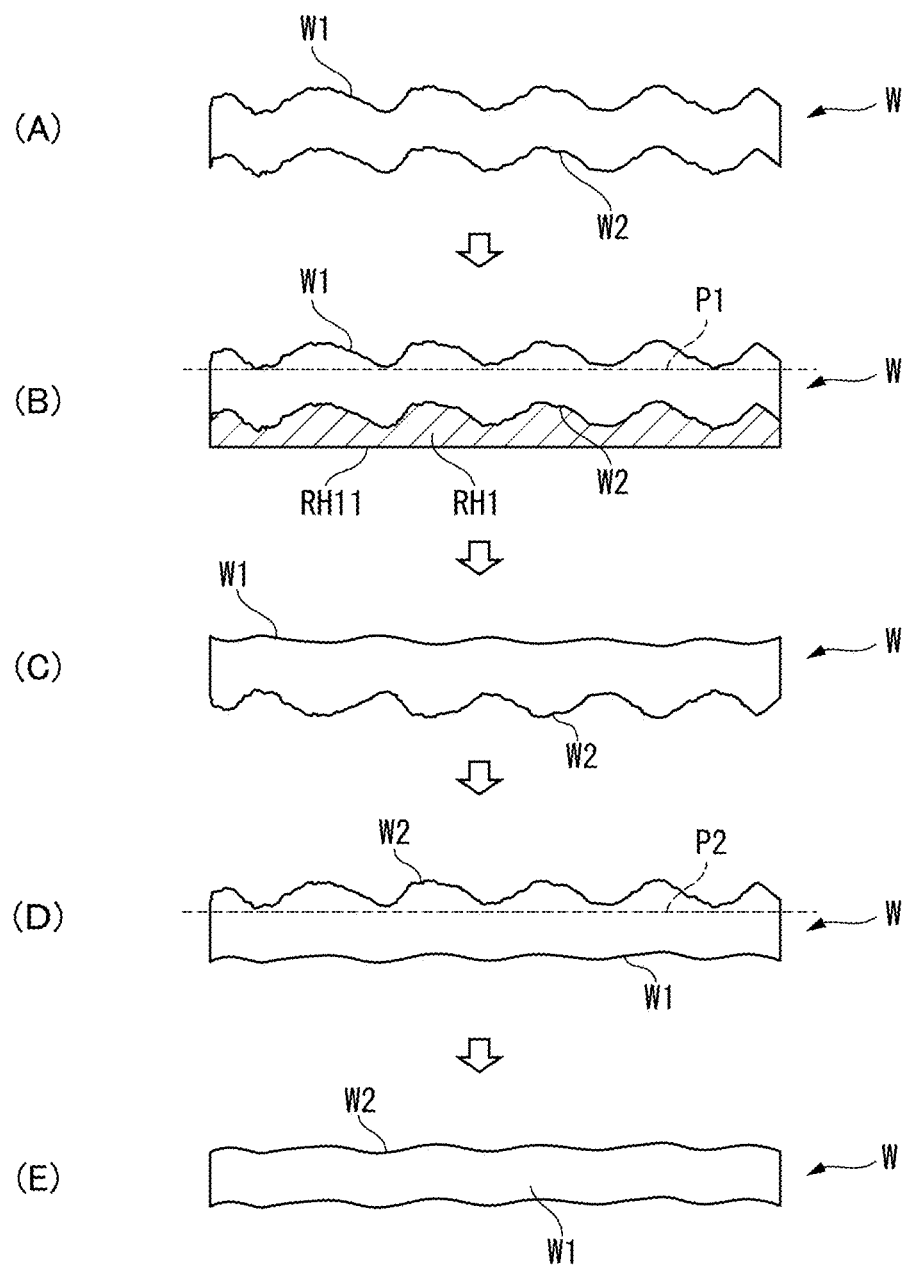
FIG. 5 illustrates steps of the manufacturing method of the wafer according to Comparatives 1 and 2 of the invention.

The conditions of the wafer in respective steps of Comparative 1 are shown in FIG. 5. In Comparative 1, the steps in the first resin-application grinding step S2, the second resin-application grinding step S3, and the third surface-grinding step S4 in Example 1 were performed except for the second coating-layer formation step S31, the second coating-layer removal step S33, and the third surface-grinding step S4.

FIGS. 5(A) to 5(D) respectively correspond to FIGS. 4(A) to 4(D) except that the second coating-layer formation step S31 is not performed in the second resin-application grinding step S3. After the steps shown in FIGS. 5(A) to 5(D), with the first surface W1 having experienced the first surface-grinding step S22 being sucked and held by the vacuum chuck table 21, the second surface W2 of the wafer W was surface-ground to the plane indicated by the dashed line P2 as shown in FIG. 5(D) (second surface-grinding step S32), thereby obtaining a wafer W of Comparative 1 as shown in FIG. 5(E). The grinding allowances in the first surface-grinding step S22 and the second surface-grinding step S32 were each 20 µm.

Comparative 2

Figure 6:
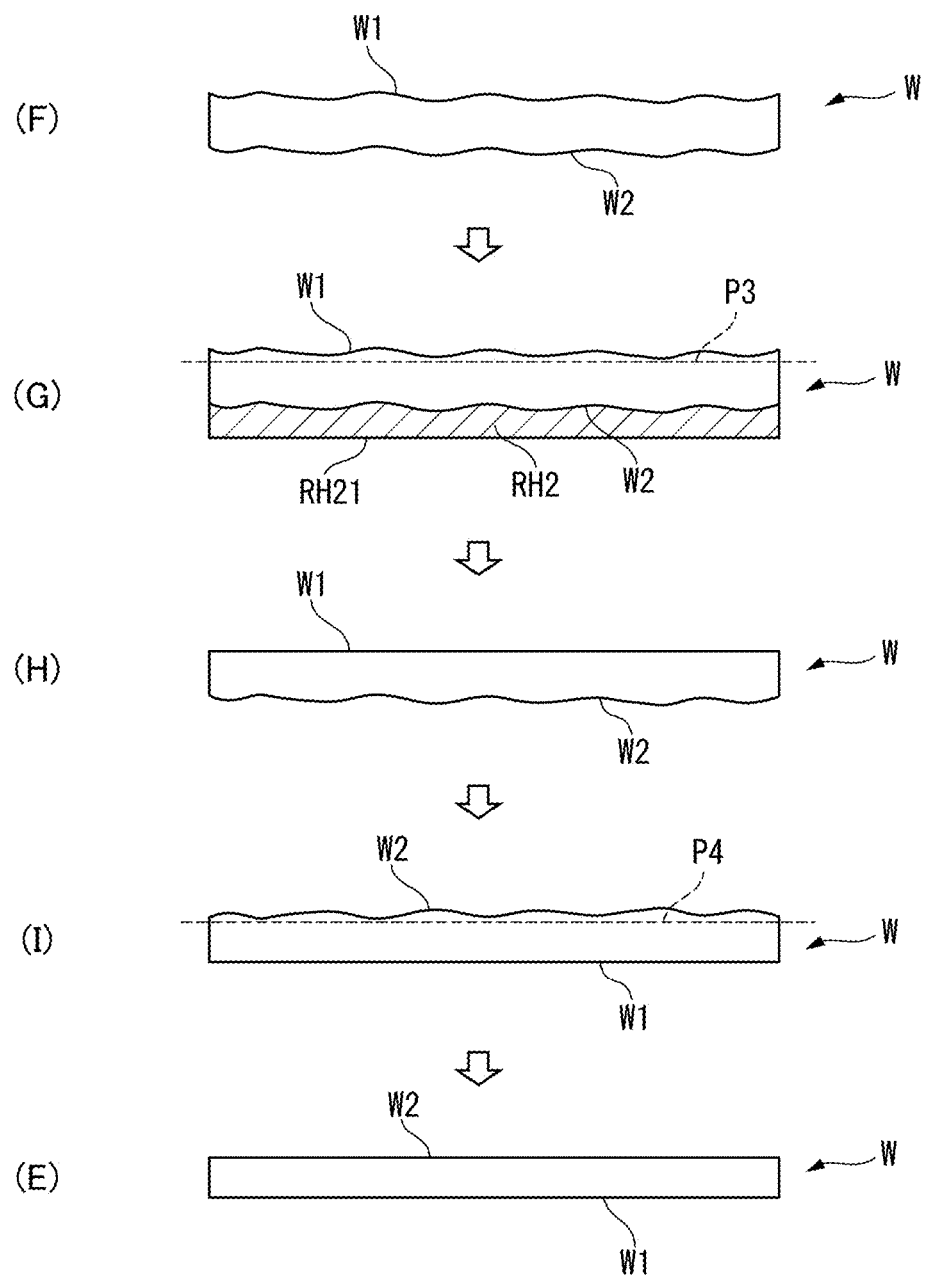
FIG. 6 illustrates steps of the manufacturing method of the wafer according to Comparative 2 subsequent to the steps shown in FIG. 5.

The conditions of the wafer in respective steps of Comparative 2 are shown in FIG. 6. In Comparative 2, the steps in Comparative 1 were repeated twice or more.

Initially, the steps of Comparative 1 shown in FIGS. 5(A) to 5(E) were performed. It should be noted that the grinding allowances in the first surface-grinding step S22 and the second surface-grinding step S32 in Comparative 2 were each 15 μm.

Next, after the wafer W was reversed as shown in FIG. 6(F) (reversing step), the second coating layer RH2 was formed on the second surface W2 of the wafer W with a UV curable resin as shown in FIG. 6(G) (second coating-layer formation step). Subsequently, with the reference surface RH21 of the second coating layer RH2 being sucked and held by the vacuum chuck table 21, the first surface W1 of the wafer W was surface-ground by a third grinding allowance of 5 μm (to the plane indicated by the dashed line P3) (third surface-grinding step). Then, as shown in FIG. 6(H), the second coating layer RH2 was peeled off (second coating-layer removal step). Then, with the first surface W1 having experienced the third surface-grinding being sucked and held by the vacuum chuck table 21, the second surface W2 of the wafer W was surface-ground by a grinding allowance of 5 μm (to the plane indicated by the dashed line P4) (fourth surface-grinding step), thereby obtaining a wafer W of Comparative 2 as shown in FIG. 6(J).

Evaluation Test 1

It was checked how the surface textures of the wafers W in Example 1 and Comparatives 1, 2 affects the nanotopography on the wafer surface after subsequent mirror-polishing.

Specifically, after the top and bottom surfaces of each of the wafers W obtained in Example 1 and Comparatives 1, 2 were coarsely polished using a double-side polishing machine, a finishing polishing was applied on the surface of each of the wafers using a single-side polishing machine to prepare wafers W whose surfaces were mirror-polished (common mirror-polishing). FIG. 7 is a nanotopography map showing measurements of level difference in each of the mirror-polished wafer surfaces measured using an optical interferometric flatness measuring machine (Wafersight 2 manufactured by KLA Tencor Corporation), which visualize the measurements of the nanotopography in gradation after the measurements of the mirror-polished wafers were filtered to remove long-wavelength components. In the level difference illustration in FIG. 7, which shows the level difference of the nanotopography, the darker color represents the lower level and the lighter color represents the higher level, where the darkest part is located at −20 nm from a central level and the lightest part is located at +20 nm from the central level. Thus, the level difference from the lowest level to the highest level is 40 nm. It should be noted that the nanotopography was measured with freely designated three points on the outer periphery of the wafer being fixed. Accordingly, the nanotopography map shows the level difference on the surface of the wafer that is unsucked.

As shown in FIG. 7, Example 1 shows substantially uniform color density, showing small level difference over the entire surface. It is speculated that the highly planarized surface with improved nanotopography characteristics can be obtained with small allowances because of the first resin-application grinding step where the nanotopography characteristics of the wafer surface are improved though the warpage and undulation are not totally removed, the second resin-application grinding step where the warpage and undulation of the wafer surface are sufficiently reduced, and the third surface-grinding step where the surface-grinding is performed with the wafer surface whose warpage and undulation are sufficiently reduced being used as the reference surface.

In Comparative 1, the level difference shown by a gradation stripe pattern is observable over the entire wafer. It is thus understood that the level difference caused by the undulation remains all over the wafer surface.

It is understood from Comparative 2, which shows substantially uniform color density, that the level difference is small over the entire surface as in Example 1. The highly planarized surface as in Example 1 can be also obtained in Comparative 2. However, in contrast to the three surface-grinding steps in Example 1, Comparative 2, which requires four surface-grinding steps, is low in productivity.

Evaluation Test 2

In the same manner as in Evaluation Test 1, it was checked how the surface textures of the wafers W affect the nanotopography on the mirror-polished wafer surface.

Figure 8:
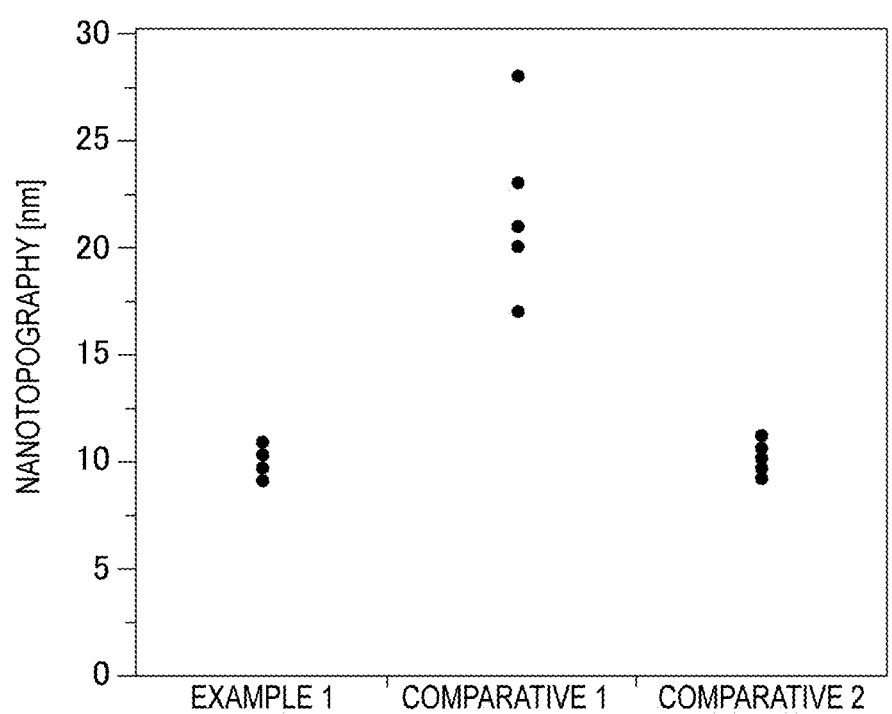
FIG. 8 illustrates measurements of nanotopography of Example 1 and Comparatives 1, 2.

In this test, a plurality of wafers W were prepared under the same conditions as those in each of Example 1 and Comparatives 1, 2, each of the plurality of wafers W being subjected to the mirror-polishing under the same conditions as those in Evaluation Test 1 (coarse polishing using the double-side polishing machine+finish polishing using the single-side polishing machine) to prepare the wafers W whose surfaces were mirror-polished. FIG. 8 is a graph showing measurements of the nanotopography on each of the mirror-polished surfaces of the wafers W (window size 10 mm) measured using an optical interferometric flatness measuring machine (Wafersight 2 manufactured by KLA Tencor Corporation).

As is clear from FIG. 8, the level difference is in a range from 9 to 11 nm in Example 1, 17 to 28 nm in Comparative 1, and 9 to 11 nm in Comparative 2. The wafers W in Example 1 and Comparative 2 each have a highly planarized surface whose entire nanotopography is 11 nm or less.

EXPLANATION OF CODE(S)

W . . . wafer, W1 . . . first surface, W2 . . . second surface

The invention claimed is:
1. A manufacturing method of a wafer produced by slicing a monocrystal ingot using a wire-saw machine and grinding the wafer, the method comprising:
  a first resin-application grinding step; a second resin-application grinding step; and a third surface-grinding step, wherein
  the first resin-application grinding step comprises:
  a first coating-layer formation step of applying a curing material all over a second surface of the wafer to form a flat first coating layer;
  a first surface-grinding step of placing the wafer on a table of a grinding machine so that the first coating layer is in contact with a reference surface of the table and, subsequently, surface-grinding a first surface of the wafer by the grinding machine; and
  a first coating-layer removal step of removing the first coating layer after the first surface-grinding step from the second surface of the wafer,
  the second resin-application grinding step comprises:

a second coating-layer formation step of applying the curing material all over the first surface of the wafer to form a flat second coating layer;

a second surface-grinding step of placing the wafer on the table of the grinding machine so that the second coating layer is in contact with the reference surface of the table and, subsequently, surface-grinding the second surface of the wafer by the grinding machine; and a second coating-layer removal step of removing the second coating layer after the second surface-grinding step from the first surface of the wafer, and the third surface-grinding step comprises:

placing the wafer on the table so that a lastly surface-ground surface is in contact with the reference surface of the table of the grinding machine and, subsequently, surface-grinding a surface of the wafer opposite the surface in contact with the reference surface by the grinding machine.

2. The method according to claim 1, wherein, between the second resin-application grinding step and the third surface-grinding step:

the first resin-application grinding step is only additionally performed; or at least one repetition of the first resin-application grinding step and the second resin-application grinding step is additionally performed in this order; or at least one repetition of the first resin-application grinding step and the second resin-application grinding step is performed in this order and, subsequently, the first resin-application grinding step is performed.

3. The method according to claim 1, wherein a grinding allowance in the first resin-application grinding step is equal to or more than a grinding allowance in the third surface-grinding step.

4. The method according to claim 1, wherein the wire-saw machine slices the monocrystal ingot using a fixed-abrasive-grain wire.

5. The method according to claim 1, wherein a diameter of the wafer is 300 mm or more.

* * * * *